United States Patent
Oh

(10) Patent No.: US 10,211,596 B2
(45) Date of Patent: Feb. 19, 2019

(54) OPTICAL SENSOR HAVING EXTERNAL CAVITY LASER OUTPUTTING SENSING AND REFERENCE LIGHT

(71) Applicant: ELECTRONICS AND TELECOMMUNICATIONS RESEARCH INSTITUTE, Daejeon (KR)

(72) Inventor: Kwang Ryong Oh, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 95 days.

(21) Appl. No.: 15/248,763

(22) Filed: Aug. 26, 2016

(65) Prior Publication Data

US 2017/0244218 A1 Aug. 24, 2017

(30) Foreign Application Priority Data

Feb. 22, 2016 (KR) .................... 10-2016-0020536

(51) Int. Cl.
*H01S 5/14* (2006.01)
*H01S 5/028* (2006.01)
(Continued)

(52) U.S. Cl.
CPC ............ *H01S 5/141* (2013.01); *H01S 5/028* (2013.01); *G01J 3/1804* (2013.01); *G01J 2003/1842* (2013.01); *G01J 2003/451* (2013.01)

(58) Field of Classification Search
CPC ................................. G01J 2003/451
See application file for complete search history.

(56) References Cited

U.S. PATENT DOCUMENTS

| | | | |
|---|---|---|---|
| 2005/0068543 A1* | 3/2005 | Angeley | G01D 5/35303 356/521 |
| 2005/0105084 A1* | 5/2005 | Wang | G01J 3/02 356/301 |

(Continued)

FOREIGN PATENT DOCUMENTS

JP 2010-276400 A 12/2010

OTHER PUBLICATIONS

Chun Ge et al., "External cavity laser biosensor", The Royal Society of Chemistry, vol. 13, No. 7, pp. 1247-1256, Apr. 7, 2013.

(Continued)

*Primary Examiner* — Michael P LaPage
(74) *Attorney, Agent, or Firm* — Rabin & Berdo, P.C.

(57) ABSTRACT

Disclosed is an optical sensor, including an external cavity laser configured to output sensing light and reference light; and a photodetector configured to detect a beating signal by an interference of the sensing light and the reference light output from the external cavity laser, in which the external cavity laser includes a reflecting filter including a sensing grating, to which a sensing object is attachable, and a reference grating, which is disposed on the same plane as that of the sensing grating, and outputs sensing light reflected from the sensing grating and reference light reflected from the reference grating. Accordingly, the optical sensor does not require a high-resolution spectroscope and has improved resolution and sensitivity.

19 Claims, 5 Drawing Sheets

(51) Int. Cl.
  *G01J 3/45* (2006.01)
  *G01J 3/18* (2006.01)

(56) References Cited

U.S. PATENT DOCUMENTS

| | | | |
|---|---|---|---|
| 2006/0040376 A1* | 2/2006 | Cunningham | B01L 3/5085 |
| | | | 435/287.1 |
| 2007/0211772 A1* | 9/2007 | Romano | H01S 5/141 |
| | | | 372/20 |
| 2010/0303121 A1* | 12/2010 | Alalusi | H01S 5/141 |
| | | | 372/92 |
| 2010/0328774 A1 | 12/2010 | Hong et al. | |
| 2011/0129846 A1 | 6/2011 | Huh et al. | |
| 2013/0188172 A1* | 7/2013 | Fu | G01N 21/0303 |
| | | | 356/51 |

OTHER PUBLICATIONS

Meng Zhang et al., "A self-referencing biosensor based upon a dual-mode external cavity laser", Applied Physics Letters, vol. 102, No. 1, pp. 213701-1-213701-4, 2013.

Meng Zhang et al., "Detection of Protein—Small Molecule Binding Using a Self-Referencing External Cavity Laser Biosensor", American Chemical Society, vol. 136, pp. 5840-5843, 2014.

\* cited by examiner

OPTICAL SENSOR HAVING EXTERNAL CAVITY LASER OUTPUTTING SENSING AND REFERENCE LIGHT

CROSS-REFERENCE TO RELATED APPLICATION

This application claims priority to and the benefit of Korean Patent Application No. 10-2016-0020536, filed on Feb. 22, 2016, in the Korean Intellectual Property Office, the entire contents of which are incorporated herein by reference in their entirety.

BACKGROUND

Field of Invention

The present disclosure relates to an optical sensor, and more particularly, to an optical sensor including an external cavity laser.

Description of the Related Art

When a material desired to be detected is attached onto a grating, a wavelength of a peak of reflectance is changed according to a refractive index of the material, so that the grating may be utilized as a sensor based on the aforementioned phenomenon. An example of the grating utilized as the sensor includes a Guided Mode Resonance Grating (GMRG). The GMRG refers to a grating operated as a high efficient band stop filter at a resonant wavelength when a grating period on a plane wave guide satisfies a resonance condition generated by a combination of incident light and a period structure.

A sensing system, which implements an External Cavity Laser (ECL) using the GMRG and measuring and digitizing a change in a wavelength by a material attached to the GMRG has been suggested. The sensing system using the GMRG in the related art has a problem in that it is necessary to digitize a fine change in an oscillation wavelength by using a high resolution spectroscope.

Further, there is a case where the sensing system using the GMRG in the related art uses one semiconductor optical amplifier in order to measure a reference oscillation wavelength and a sensing oscillation wavelength at one time, and when a reference mode and an oscillation mode are close, only one mode is oscillated by a mode competition, so that it is impossible to measure the wavelength.

SUMMARY

The present disclosure has been made in an effort to solve the above-described problems associated with the prior art, and provides a high-resolution and high-sensitive optical sensor requiring no high-resolution spectroscope.

An exemplary embodiment of the present disclosure provides an optical sensor, including: an external cavity laser configured to output sensing light and reference light; and a photodetector configured to detect a beating signal by an interference of the sensing light and the reference light output from the external cavity laser, in which the external cavity laser includes a reflecting filter including a sensing grating, to which a sensing object is attachable, and a reference grating, which is disposed on the same plane as that of the sensing grating, and outputs sensing light reflected from the sensing grating and reference light reflected from the reference grating.

Each of the sensing grating and the reference grating may reflect light at a resonant wavelength.

Each of sensing grating and the reference grating may include a core layer, and a grating layer laminated on the core layer, the sensing grating and the reference grating may have the same grating characteristic, and the grating characteristic may include at least one of a grating period, a thickness of a grating layer, and a thickness of a core layer.

The external cavity laser may further include an oscillating part, in which a first channel light source outputting the reference light and a second channel light source outputting the sensing light are formed, and the oscillating part may be located between the photodetector and the reflecting filter.

In the first channel light source, light incident from the first channel light source to the reference grating may be returned to the first channel light source at a resonant wavelength and may be output as the reference light, and in the second channel light source, light incident from the second channel light source to the sensing grating may be returned to the second channel light source at a reflectance peak wavelength, which is determined based on a refractive index of the sensing object attached to the sensing grating, and may be output as the sensing light.

The external cavity laser may further include a first collimator located between the oscillating part and the reflecting filter, the oscillating part, the first collimator, and the reflecting filter may be arranged along an optical axis of the first collimator.

The first channel light source and the second channel light source may be extended to align with the optical axis of the first collimator.

The first channel light source and the second channel light source may be spaced apart from each other in a direction vertical to the optical axis of the first collimator.

Each of the first channel light source and the second channel light source may be spaced apart from the optical axis of the first collimator.

The reference grating may be disposed at a side at which light emitted from the first channel light source is converted into parallel light by the first collimator and is incident to.

The sensing grating may be disposed at a side at which light emitted from the second channel light source is converted into parallel light by the first collimator and is incident to.

An anti-reflective film may be deposited on a surface of the oscillating part facing the first collimator, and the oscillating part may be a two-channel single integrated laser diode, in which each of the first channel light source and the second channel light source is a super luminescence diode.

The photodetector may be disposed so as to face an opposite surface of the surface of the oscillating part on which the anti-reflective film is deposited, and the surface of the oscillating part facing the photodetector may be a reflective surface.

Each of the first channel light source and the second channel light source may be extended from the surface of the oscillating part, on which the anti-reflective film is deposited, to the opposite surface of the oscillating part.

The optical sensor may further include a second collimator provided between the photodetector and the oscillating part.

Another exemplary embodiment of the present disclosure provides an optical sensor, including: an external cavity laser configured to output sensing light and reference light; a photodetector configured to detect a beating signal by an interference of the sensing light and the reference light output from the external cavity laser; and a coupler configured to optically couple the external cavity laser and the photodetector, in which the external cavity laser includes a reflecting filter including a sensing grating, to which a sensing object is attachable, and a reference grating, which is disposed on the same plane as that of the sensing grating, and outputs sensing light reflected from the sensing grating and reference light reflected from the reference grating.

The coupler may multiplex the sensing light and the reference light input from the external cavity laser and outputs a beating signal by the interference of the sensing light and the reference light, and the photodetector may detect the beating signal output from the coupler.

The coupler may include a Y coupler including a reference light waveguide, into which the reference light is input, a sensing light waveguide, into which the sensing light is input, and an output waveguide, in which the reference light waveguide and the sensing light waveguide are joined and extended.

The coupler may further include diffraction reflective gratings (distributed Bragg reflectors), which are coupled to an input terminal of the reference light waveguide and an input terminal of the sensing light waveguide, respectively.

The external cavity laser may further include an oscillating part, in which a first channel light source outputting the reference light and a second channel light source outputting the sensing light are formed, and the oscillating part may be located between the photodetector and the reflecting filter, the first channel light source may be optically coupled with the reference light waveguide, and the second channel light source may be optically coupled with the sensing light waveguide.

The external cavity laser may further include a first collimator located between the oscillating part and the reflecting filter, the oscillating part, the first collimator, and the reflecting filter may be arranged along an optical axis of the first collimator, the output waveguide may be extended along the optical axis of the first collimator, and each of the first channel light source and the second channel light source may be extended so as to align with the optical axis of the first collimator and is spaced apart from the optical axis of the first collimator.

According to the exemplary embodiments of the present disclosure, the optical sensor measures a beating signal by an interference of reference light and sensing light of an external cavity laser and detects a sensing object, so that it is possible to detect the sensing object with high sensitivity and high resolution without a high sensitive spectroscope.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Figure 1:
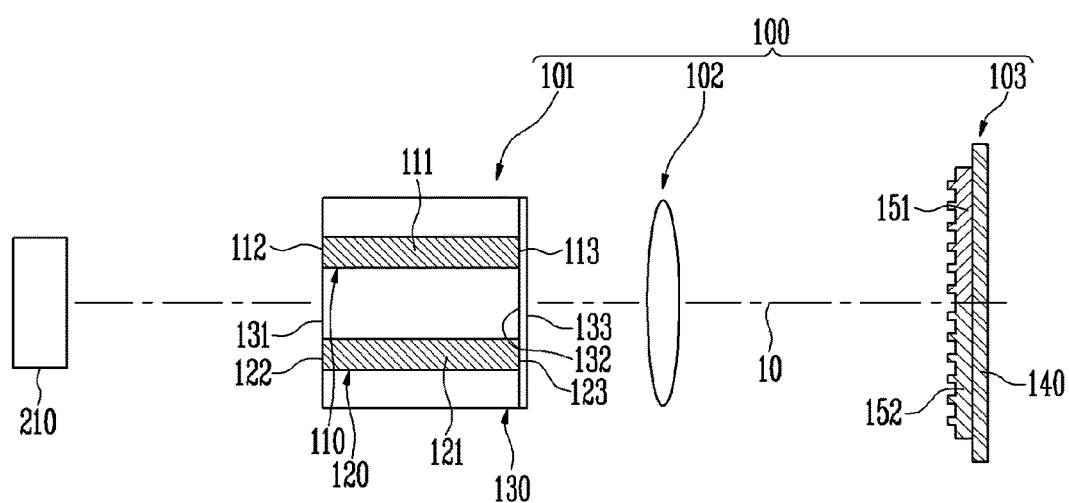
FIG. 1 is a diagram of an exemplary embodiment of the present disclosure.

Advantages and features of the present disclosure and methods accomplishing the advantages and features will become apparent from the following detailed description of exemplary embodiments with reference to the accompanying drawings. However, the present disclosure is not limited to exemplary embodiments disclosed below and may be implemented in various forms, and when one constituent element referred to as being "connected to" another constituent element, one constituent element can be directly coupled to or connected to the other constituent element, but intervening elements may also be present. Further, an irrelevant part to the present disclosure is omitted to clarify the description of the present disclosure, and like reference numerals designate like elements throughout the specification.

The exemplary embodiments will be described in detail with reference to the accompanying drawings so that those skilled in the art may easily carry out the present disclosure.

FIG. 1 is a diagram of an exemplary embodiment of the present disclosure. An optical sensor according to the exemplary embodiment of the present disclosure includes an external cavity laser 100 for outputting sensing light and reference light, and a photodetector 210 for detecting a beating signal $\Delta\omega$ by an interference of the sensing light $\omega s$ and the reference light $\omega_r$ output from the external cavity laser 100. The external cavity laser 100 outputs the sensing light $\omega s$ and the reference light $\omega r$ in the same direction so that the beating signal $\Delta\omega$ is generated by the interference of the sensing light $\omega s$ and the reference light $\omega_r$ output from an oscillating part 101.

The external cavity laser 100 includes the oscillating part 101, and a reflecting filter 103 for reflecting light incident from the oscillating part 101 to the oscillating part 101 at a specific wavelength. The external cavity laser 100 may further include a first collimator 102 for making a laser beam, which is emitted from the oscillating part 101 to the reflecting filter 103, to parallel light.

The first collimator 102 is disposed between the oscillating part 101 and the reflecting filter 103, and the oscillating part 101, the first collimator 102, and the reflecting filter 103 are arranged in an optical axis 10 of the first collimator 102. As an exemplary embodiment, the first collimator 102 may be a convex lens.

The reflecting filter 103 includes a sensing grating 151, a reference grating 152 disposed on the same plane as that of the sensing grating 151, and a substrate 140 supporting both the sensing grating 151 and the reference grating 152. A grating layer are disposed on each of the sensing grating 151 and the reference grating 152 toward the oscillating part 101, and an opposite surface of the grating layer is supported by the substrate 140.

The substrate 140 may have any shape which is capable of fixing both the sensing grating 151 and the reference grating 152 on the same plane. The substrate 140 may have various shapes, such as a plate shape and a frame shape.

In the exemplary embodiment, the grating layer of each of the sensing grating 151 and the reference grating 152 is disposed toward the oscillating part 101, but the present disclosure is not limited thereto. For convenience of the description, when a surface of each of the sensing grating and the reference grating, on which the grating layer is formed, is referred to as a front surface, and an opposite surface thereof is referred to as a rear surface, the sensing grating and the reference grating may also be disposed so that the rear surfaces of the sensing grating and the reference grating face the oscillating part 101 as another exemplary embodiment. That is, the disposition of the sensing grating and the reference grating may be changed according to a sensing object.

A sensing object may be attached onto the grating layer of the sensing grating 151. Further, the reference grating 152 is a grating for oscillating the reference light $\omega_r$, and a separate material is not attached to the reference grating 152. That is, the sensing grating 151 and the reference grating 152 are simply defined by a difference in whether a sensing object is attached or not, and configurations, such as a grating period, a thickness of the grating layer, and a thickness of a core layer, determining a characteristic of the grating are the same as each other. The sensing grating 151 and the reference grating 152 may also be integrally or separately formed. This will be described in detail.

Each of the sensing grating 151 and the reference grating 152 has a characteristic of a Guided Mode Resonance Grating (GMRG). The GMRG refers to a grating which reflects light of a resonant wavelength when a period of a grating on a plane waveguide satisfies a resonance condition generated by incident light and a grating structure. The GMRG is operated as a high efficient band stop filter at a resonant wavelength. A configuration of the GMRG will be described with reference to FIGS. 2 to 4.

In each of the sensing grating 151 and the reference grating 152, a core layer 52 and a grating layer 53 may be sequentially formed on a Silicon on Insulator (SOI) wafer 51. The core layer 52 may be formed of a material including SiNx, for example, $Si_3N_4$. Further, the grating layer 53 may have a predetermined grating period $\Lambda$, and may include $SiO_2$.

Figure 3:
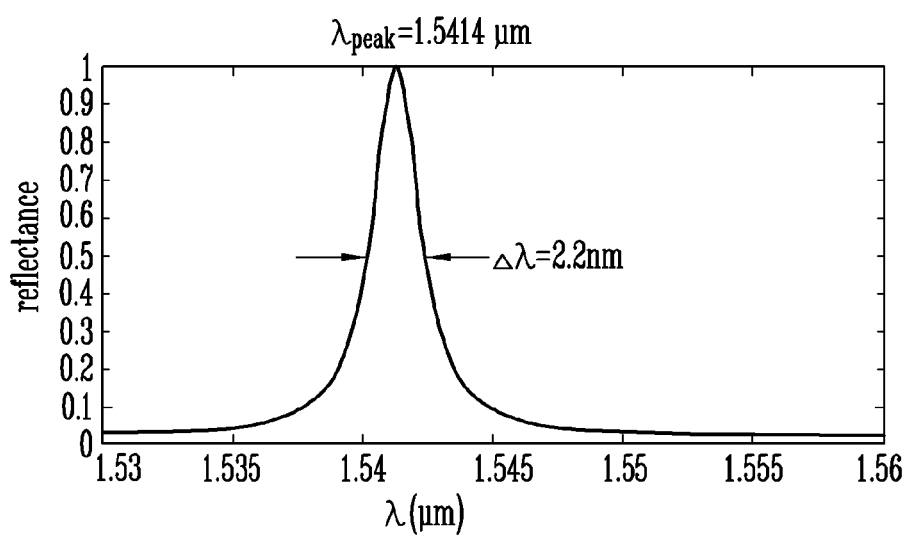
FIG. 3 is a graph illustrating a reflection spectrum when the grating of FIG. 2 is exposed to the air.
Figure 4:
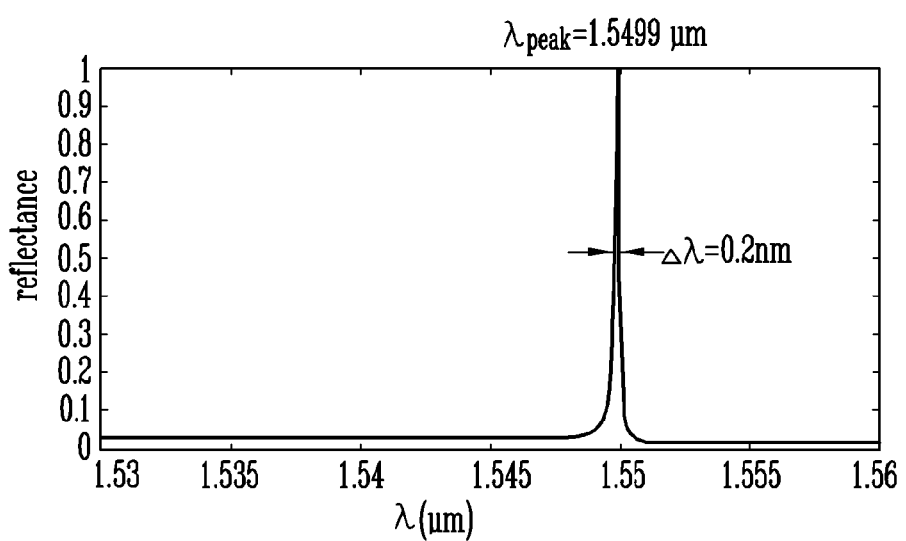
FIG. 4 is a graph illustrating a reflection spectrum when the grating of FIG. 2 is covered by water.

FIGS. 3 and 4 are graphs illustrating reflection spectrums when the GMRG is exposed to the air and GMRG is exposed to water. A thickness of the core layer 52 of the GMRG used in the design is 0.31 μm, and a refractive index when the core layer 52 includes $Si_3N_4$ is 1.989. Further, the grating period $\Lambda$ of the grating layer 53 is 0.881 μm, and a thickness of the grating is 0.45 μm, and a refractive index is 1.44.

The GMRG exhibits a reflection filter characteristic to vertical incident light in a narrow band, and a reflectance peak wavelength is changed according to a refractive index of a material attached to the surface, on which the grating layer is formed, so that the GMRG may be utilized as a high-sensitive sensor by using the aforementioned phenomenon.

FIG. 3 is a graph representing reflectance according to a wavelength λ of vertically incident light in a state where the grating layer 53 is exposed to the air, and a case where reflectance on a y-axis is means that the light is reflected 100%, and a case where reflectance is 0 means the light penetrates 100%. Referring to FIG. 3, a reflectance peak wavelength of the GMRG exposed to the air is about 1.5414 μm, and a half-width $\Delta\lambda$ of the GMRG exposed to the air is about 2.2 nm.

FIG. 4 is a graph representing reflectance according to a wavelength λ of vertically incident light in a state where the grating layer 53 is covered by water, and a case where reflectance on a y-axis is means that the light is reflected 100%, and a case where reflectance is 0 means the light penetrates 100%. Referring to FIG. 4, a reflectance peak wavelength of the GMRG, in which a surface of the grating is covered by water, is about 1.5499 μm, and a half-width $\Delta\lambda$ of the GMRG is about 0.2 nm. A refractive index of air is 1 and a refractive index of water is 1.33, and a refractive index of the material attached to the grating layer is changed, so that it can be seen that a reflectance peak wavelength is changed.

However, the GMRG having the aforementioned structure is an example for explaining a characteristic of the GMRG, and the sensing grating 151 and the reference grating 152 of the present disclosure are not limited thereto. Any GMRG, which reflects light of a resonant wavelength in a resonance condition determined by incident light and a grating structure, may be accepted as the sensing grating 151 and the reference grating 152.

The substrate 140 may be formed of silicon or glass. For example, the substrate 140 may be substantially formed of the same material as that of the SOI wafer 53, and may be integrally formed with the SOI wafer 53. However, the substrate 140 may be omitted as necessary. For example, when the sensing grating 151 and the reference grating 152 are integrally formed, the substrate 140 may be omitted.

The oscillating part 101 includes a first channel light source 110 outputting the reference light $\omega_r$, a second channel light source 120 outputting the sensing light $\omega_s$, and a substrate 130 on which the first channel light source 110 and the second channel light source 120 are integrated.

Each of the first channel light source 110 and the second channel light source 120 is extended in a direction which aligns with the optical axis 10 of the first collimator 102. The first channel light source 110 and the second channel light source 120 are disposed at positions which are symmetric based on the optical axis 10 of the collimator, and are disposed while being spaced apart from each other. A spaced distance of the first channel light source 110 from the optical axis 10 of the collimator is the same as a spaced distance of the second channel light source 120 from the optical axis 10 of the first collimator 102.

The first channel light source 110 includes a first semiconductor laser activating unit 111, a reference light output terminal 112 facing the photodetector 210, and an input/output terminal 113 facing the reflecting filter 103.

The second channel light source 120 includes a second semiconductor laser activating unit 121, a sensing light output terminal 122 facing the photodetector 210, and an input/output terminal 123 facing the reflecting filter 103.

The substrate 130 includes a first surface 131 facing the photodetector 210 and a second surface 132 facing the reflecting filter 103. The second surface 132 is disposed on an opposite side of the first surface 131 of the substrate 130. The substrate 130 further includes an anti-reflective film 133 deposited on the second surface 132. The first surface 131 of the substrate 130 is a cleaved surface. The first surface 131 of the substrate 130 is a reflective surface.

Each of the first channel light source 110 and the second channel light source 120 is extended from the first surface 131 of the substrate 130 to the second surface 132. Each of the reference light output terminal 112 of the first channel light source 110 and the sensing light output terminal 122 of the second channel light source 120 meets the first surface 131 of the substrate 130. Each of the input/output terminal 113 of the first channel light source 110 and the input/output terminal 123 of the second channel light source 120 meets the second surface 132 of the substrate 130, and the anti-reflective film 133 is deposited at an end of each of the input/output terminal 113 of the first channel light source 110 and the input/output terminal 123 of the second channel light source 120.

The substrate 130 is a substrate applied to a semiconductor layer, and any publicly known substrate is acceptable. For example, the substrate 130 may include indium-phosphide.

Figure 5:
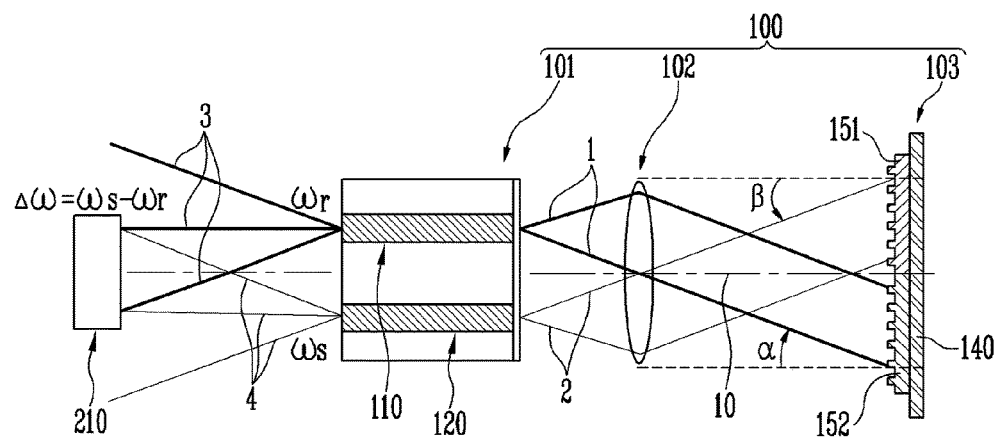
FIG. 5 is a state view of an operation of the exemplary embodiment of FIG. 1.

FIG. 5 is a state view of an operation of the exemplary embodiment of the present disclosure. The configuration of the exemplary embodiment of the present disclosure will be described in more detail with reference to FIGS. 1 and 5.

The oscillating part 101 is arranged so that the second surface 132, on which the anti-reflective film 133 is deposited, is located at a focal distance of the first collimator 102, and the center between the first channel light source 110 and the second channel light source 120 corresponds to the optical axis 10 of the first collimator 102.

The reference grating 152 is disposed at a side at which light 1 output from the first channel light source 110 to the second surface 132 is incident at an incident angle of α while passing through the first collimator 102. The sensing grating 151 is disposed at a side at which light 2 output from the second channel light source 120 to the second surface 132 is incident at an incident angle of β while passing through the first collimator 102.

The first channel light source 110 and the second channel light source 120 are symmetrically disposed based on the optical axis 10 of the first collimator 102, so that the sensing grating 151 and the reference grating 152 are also symmetrically disposed based on the optical axis 10 of the first collimator 102. The first channel light source 110 and the reference grating 152 are located at opposite sides based on the optical axis 10 of the first collimator 102, and the sensing grating 151 and the reference grating 152 are located at opposite sides based on the optical axis 10 of the first collimator 102.

The light at the resonant wavelength reflected at the angle of α, that is, the same angle as the incident angle, under the resonance condition by the grating characteristic of the reference grating 152 and the light of the first channel light source 110 is input into the first channel light source 110 through the input/output terminal 113 of the first channel light source.

Figure 2:
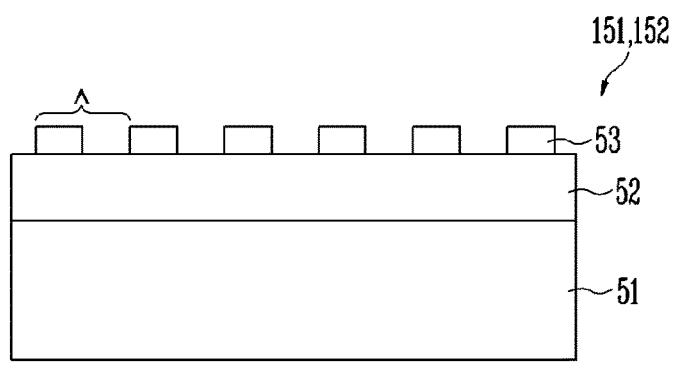
FIG. 2 is a side view of a grating provided in the exemplary embodiment of the present disclosure of FIG. 1.

The reflectance peak wavelength of the sensing grating 151 is changed according to a sensing object attached onto the grating layer, and this has been described with reference to FIGS. 2 to 4. In the sensing grating 151, a wavelength of the light reflected at an angle of β, that is, the same angle as the incident angle, is determined according to a sensing object, and the light at the wavelength reflected by the sensing grating 151 is input into the second channel light source 120 through the input/output terminal 123 of the second channel light source.

The first channel light source 110 and the second channel light source 120 may output light in a bandwidth including both the resonant wavelength and the reflectance peak wavelength determined according to the sensing object to the reflecting filter 103.

Each of the first channel light source 110 and the second channel light source 120 may be a laser diode. In this case, the oscillating part 101 may be a semiconductor laser in which a laser diode is single-integrated in two channels. For example, the first channel light source 110 and the second channel light source 120 may be publicly known super luminescence diodes. However, the first channel light source 110 and the second channel light source 120 are not limited thereto, any light source, which is capable of outputting light in the aforementioned bandwidth and finally outputting the reference light and the sensing light returned to the respective channels, may be accepted as the first channel light source 110 and the second channel light source 120.

When the light at a specific wavelength in the light output from each of the first channel light source 110 and the second channel light source 120 to the reflecting filter 103 is reflected and is input into the first channel light source 110 and the second channel light source 120 again, the external cavity laser 100 is driven and reference light 3 ($\omega_r$) is output from the reference light output terminal 112 of the first channel light source 110 and reference light 4 ($\omega_s$) is output from the sensing light output terminal 122 of the second channel light source 120.

The photodetector 210 is disposed at a position, at which the two light 3 and 4 output from the first surface 131 of the oscillating part 101 overlap, and detects a beating signal Δω by an interference of the sensing light $\omega_s$ and the reference light $\omega_r$. The photodetector 210 may be a photo diode as an exemplary embodiment. However, the present disclosure is not limited thereto, and any photodetector having a configuration, which is capable of detecting a beating signal by an interference of the sensing light and the reference light oscillated by the external cavity laser 100, may be accepted as the photodetector 210.

Figure 6:
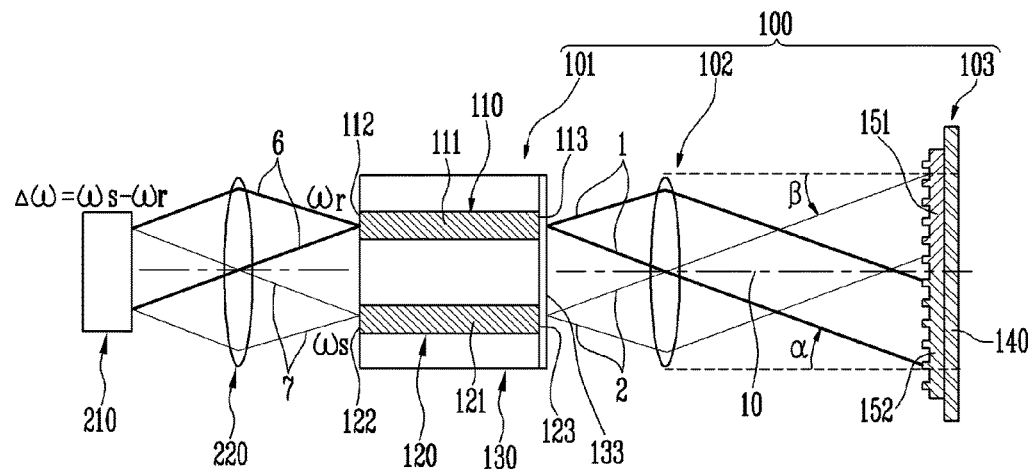
FIG. 6 is a diagram of another exemplary embodiment of the present disclosure.

FIG. 6 is a diagram of another exemplary embodiment of the present disclosure. In the exemplary embodiment of FIG. 6, a second collimator 220 is further included between the external cavity laser 100 and the photodetector 210 of the exemplary embodiment of FIG. 1, so that it is possible to change each of reference light $\omega_r$ and sensing light $\omega_s$ output from the external cavity laser 100 to parallel light.

The second collimator 220 is concentrically aligned with the optical axis 10 of the first collimator 102. The second collimator 220 may be a convex lens, but is not limited thereto.

The photodetector 210 is aligned at a focal distance of the second collimator 220, and is disposed at a position at which the reference light $\omega_r$ and the sensing light $\omega_s$ converted into the parallel light overlap. The first surface 131 of the oscillating part 101 is aligned at a focal distance of the second collimator 220. Reference light 6 and sensing light 7 output from the oscillating part 101 are converted into parallel light by the second collimator and are incident into the photodetector 210, so that there is an effect in that an overlapping region of the reference light $\omega_r$ and the sensing light $\omega_s$ is further increased than that of the exemplary embodiment of FIG. 1.

Figure 7:
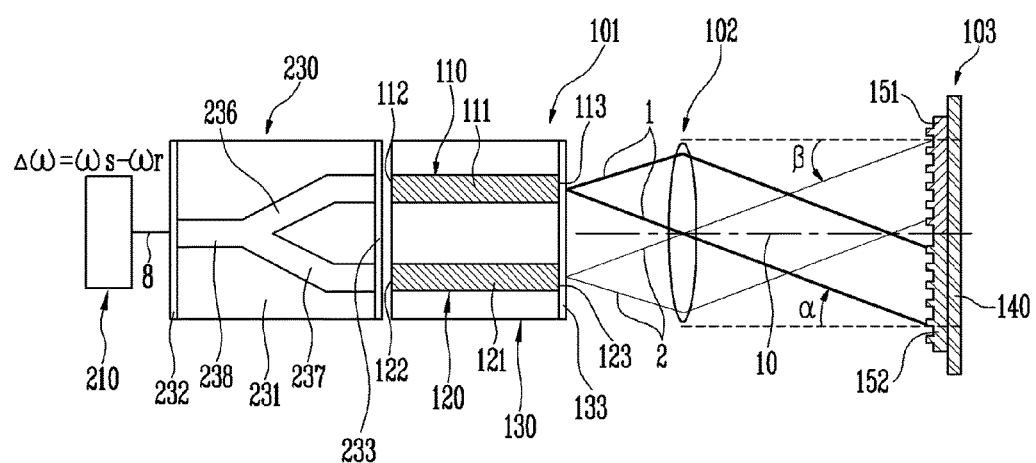
FIG. 7 is a diagram of another exemplary embodiment of the present disclosure.

FIG. 7 is a diagram of another exemplary embodiment of the present disclosure. In the exemplary embodiment of FIG. 7, a coupler is further included between the external cavity laser 100 and the photodetector 210 of the exemplary embodiment of FIG. 1. The coupler optically combines the external cavity laser 100 and the photodetector 210. The coupler includes a Y coupler 230 which receives the sensing light $\omega_s$ and the reference light $\omega_r$ output from the external cavity laser 100, and outputs a beating signal $\Delta\omega$ by an interference of the sensing light and the reference light.

In the Y coupler 230, Y-shaped waveguides 236, 237, and 238 are formed on a silica or polymer based substrate 231. The Y-shaped waveguides include a reference light waveguide 236, which is optically coupled with the first channel light source 110, a sensing light waveguide 237, which is optically coupled with the second channel light source 120, and an output waveguide 238, in which the reference light waveguide 236 and the sensing light waveguide 237 are joined, and which outputs a beating signal 8. The output waveguide 238 is extended along the optical axis 10 of the first collimator 102, and is optically coupled with the photodetector 210.

An anti-reflective film 233 is deposited on a surface of the Y coupler 230, which is optically coupled with each of the first channel light source 110 and the second channel light source 120 of the oscillating part 101, and an anti-reflective film 232 is deposited on a surface of the Y coupler 230, which is optically coupled with the photodetector 210. A particular configuration of the Y coupler 230 is publicly known, so that a detailed description thereof will be omitted.

The Y coupler 230 may be manufactured with the oscillating part 101 by a hybrid integration process.

Figure 8:
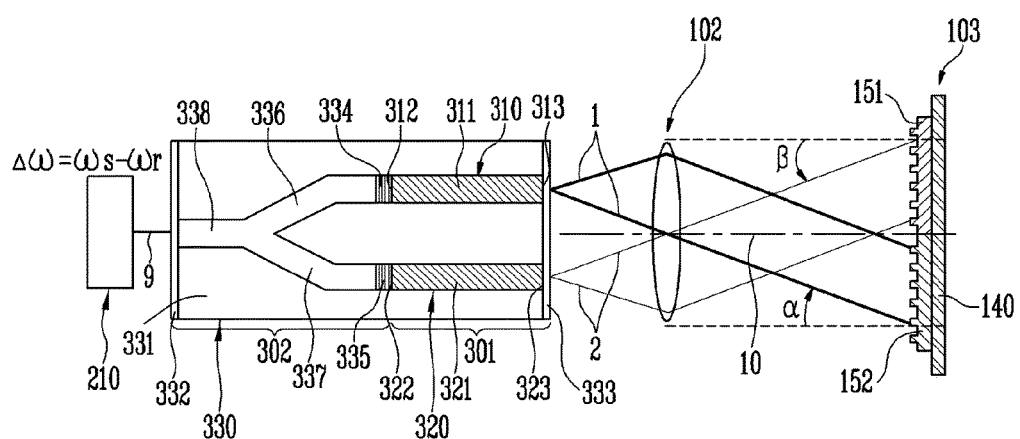
FIG. 8 is a diagram of another exemplary embodiment of the present disclosure.

FIG. 8 is a diagram of another exemplary embodiment of the present disclosure. The optical sensor according to the exemplary embodiment of FIG. 8 includes an external cavity laser 301, 102, and 103 for outputting sensing light and reference light, respectively, a photodetector 210 for detecting a beating signal $\Delta\omega$ by an interference of the sensing light $\omega_s$ and the reference light $\omega_r$ output from the external cavity laser, and a coupler 302 for optically coupling the external cavity laser and the photodetector. The photodetector 210 is the same as the photodetector of the exemplary embodiment of FIG. 1, so that a detailed description thereof will be omitted.

The external cavity laser includes an oscillating part 301, a reflecting filter 103 for reflecting light incident from the oscillating part 301 to the oscillating part 301 at a specific wavelength, and a first collimator 102 which is disposed between the oscillating part 301 and the reflecting filter 103 and converts a laser beam emitted from the oscillating part 301 to the reflecting filter 103 into parallel light. The first collimator 102 and the reflecting filter 103 are the same as those of the exemplary embodiment of FIG. 1, so that a detailed description thereof will be omitted.

The oscillating part 301 includes a first channel light source 310 for outputting the reference light $\omega_r$ and a second channel light source 320 for outputting the sensing light $\omega_s$, and is single-integrated to a substrate 331. Each of the first channel light source 310 and the second channel light source 320 is extended in parallel to the optical axis 10 of the first collimator 102, and is spaced apart from each other in a direction which aligns with the optical axis 10 of the first collimator 102. The disposition of the first channel light source 310 and the second channel light source 320 is substantially the same as that of the first channel light source 110 and the second channel light source 120 of the exemplary embodiment of FIG. 1.

The first channel light source 310 includes a first semiconductor laser activating unit 311, a reference light output terminal 312 facing the coupler 302, and an input/output terminal 313 facing the reflecting filter 103.

The second channel light source 320 includes a second semiconductor laser activating unit 321, a reference light output terminal 322 facing the coupler 302, and an input/output terminal 323 facing the reflecting filter 103.

The detailed configuration of each of the first channel light source 310 and the second channel light source 320 is the same as that of the first channel light source 110 and the second channel light source 120 of the exemplary embodiment of FIG. 1. Further, the oscillation principle of the reference light $\omega_r$ and the sensing light $\omega_s$ in the external cavity laser 301, 102, and 103 have been described, so that a detailed description thereof will be omitted.

The coupler 302 includes a first channel diffractive reflection grating 334, a second channel diffractive reflection grating 335, and a Y coupler which are integrated on the substrate 331. In the Y coupler, Y-shaped waveguides 336, 337, and 338 are formed on the substrate 331.

The Y-shaped waveguides include a reference light waveguide 336, which is optically coupled with the first channel light source 310, a sensing light waveguide 337, which is optically coupled with the second channel light source 320, and an output waveguide 338, in which the reference light waveguide 336 and the sensing light waveguide 337 are joined, and which outputs a beating signal 9. The output waveguide 338 is extended along the optical axis 10 of the first collimator 102, and is optically coupled with the photodetector 210.

The first channel diffractive reflection grating 334 is coupled between the reference light output terminal 312 of the first channel light source 310 and an input terminal of the reference light waveguide 336. The second channel diffractive reflection grating 335 is coupled between the sensing light output terminal 322 of the second channel light source 320 and an input terminal of the sensing light waveguide 337.

The first and second diffractive reflection gratings 334 and 335 reflect the light generated in the first channel light source 310 and the second channel light source 320 in entire bandwidths of the light, respectively, and form external cavities together with the reflecting filter 103.

In the present exemplary embodiment, the oscillating part 301 and the coupler 302 are single-integrated on one substrate 331. An anti-reflective film 333 is deposited on a first surface of the substrate 331 facing the reflecting filter 103, and an anti-reflective film 332 is deposited on a second surface of the substrate 331 facing the photodetector 210. The substrate 331 may be substantially formed of the same material as that of the substrate 130 of the exemplary embodiment of FIG. 1.

The optical sensors according to the exemplary embodiments of the present disclosure may detect a beating signal by an interference of sensing light and reference light, so that it is possible to implement an optical sensor of a high-resolution of about 1 pm and high sensitivity even without a high-resolution spectroscope.

Figure 9:
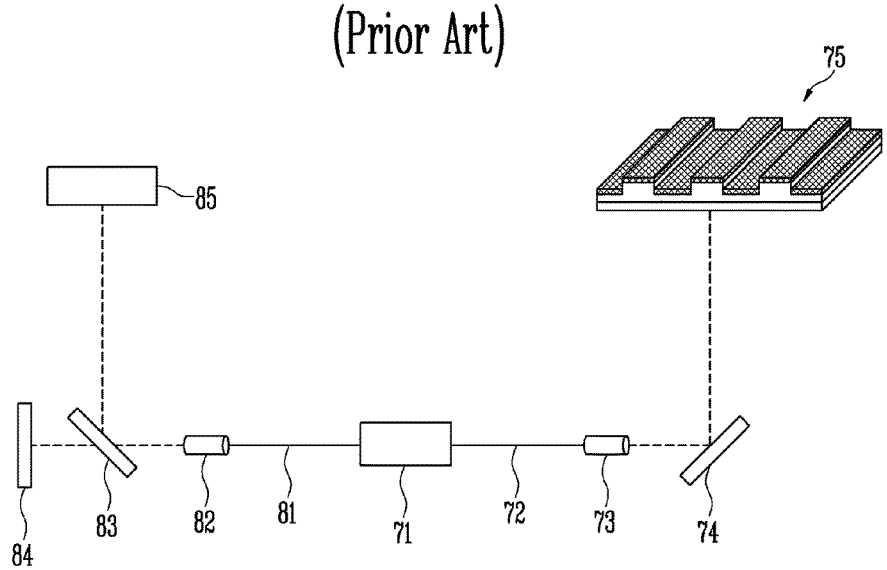
FIG. 9 is a diagram schematically illustrating a sensing system using a GMRG in the related art.
Figure 10:
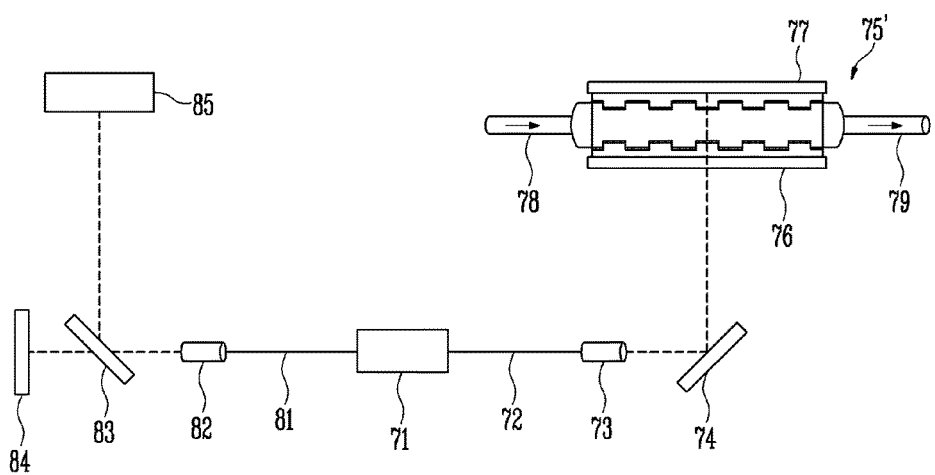
FIG. 10 is a diagram schematically illustrating a sensing system using a GMRG in the related art.

FIGS. 9 and 10 are diagrams schematically illustrating a sensing system using a GMRG in the related art. The sensing system in the related art requires a high-resolution spectroscope. The sensing system of FIG. 9 includes a semiconductor optical amplifier 71, optical fibers 72 and 81, collimators 73 and 82, reflectors 74 and 84, a beam splitter 83, a GMRG filter 75, and a spectroscope 85. A part indicated with a dotted line in FIG. 9 means a laser beam.

The sensing system of FIG. 9 is a system, which digitizes a fine change of a resonant wavelength reflected in the GMRG filter 75 with the high-resolution spectroscope 85 and detects a material when a sensing object is not attached onto the GMRG filter 75 and when a sensing object is attached onto the GMRG filter 75. In a case of the sensing system, the high-resolution spectroscope is required and it is cumbersome to separately measure a reference wavelength having no sensing object.

A sensing system of FIG. 10 uses a filter 75', in which a reference GMRG filter 77 and a sensing GMRG filter 76 are arranged so as to face each other, instead of the GMRG filter 75 of FIG. 9, and uses one semiconductor optical amplifier 71 that is a gain medium to implement a dual mode oscillating external cavity laser in which a reference mode and a sensing mode are oscillated at the same time. The remaining configurations are the same as those of the sensing system of FIG. 9 and are denoted with the same reference numerals. A part indicated with a dotted line in FIG. 10 means a laser beam.

The sensing system of FIG. 10 may transfer a sensing object onto the sensing GMRG filter 76 through tubes 78 and 79. The sensing system of FIG. 10 may detect a sensing object through one measurement of a difference between a reference oscillation wavelength and a sensing oscillation frequency, but when the two modes becomes very close according to the use of one gain medium, only one mode is oscillated by a mode competition, so that the sensing system cannot measure a difference between a reference oscillation wavelength and a sensing oscillation wavelength.

The exemplary embodiments of the present disclosure have an effect in that it is possible to measure a difference between a reference oscillation wavelength and a sensing oscillation wavelength through once measurement without occurrence of a mode competition exhibited in the sensing system of FIG. 10.

What is claimed is:

1. An optical sensor, comprising:
an external cavity laser configured to output sensing light and reference light; and
a photodetector configured to detect a beating signal by an interference of the sensing light and the reference light output from the external cavity laser,
wherein the external cavity laser includes a reflecting filter including a sensing grating, to which a sensing object is attachable, and a reference grating, which is disposed on the same plane as that of the sensing grating, and outputs sensing light reflected from the sensing grating and reference light reflected from the reference grating, and
an oscillating part, in which a first channel light source outputting the reference light and a second channel light source outputting the sensing light are formed, wherein the oscillating part is located between the photodetector and the reflecting filter.

2. The optical sensor of claim 1, wherein each of the sensing grating and the reference grating reflects light at a resonant wavelength.

3. The optical sensor of claim 1, wherein each of sensing grating and the reference grating includes a core layer, and a grating layer laminated on the core layer,
the sensing grating and the reference grating have the same grating characteristic, and
the grating characteristic includes at least one of a grating period, a thickness of a grating layer, and a thickness of a core layer.

4. The optical sensor of claim 1, wherein in the first channel light source, light incident from the first channel light source to the reference grating is returned to the first channel light source at a resonant wavelength and is output as the reference light, and
in the second channel light source, light incident from the second channel light source to the sensing grating is returned to the second channel light source at a reflectance peak wavelength, which is determined based on a refractive index of the sensing object attached to the sensing grating, and is output as the sensing light.

5. The optical sensor of claim 1, wherein the external cavity laser further includes a first collimator located between the oscillating part and the reflecting filter, and
the oscillating part, the first collimator, and the reflecting filter are arranged along an optical axis of the first collimator.

6. The optical sensor of claim 5, wherein the first channel light source and the second channel light source are extended to align with the optical axis of the first collimator.

7. The optical sensor of claim 5, wherein the first channel light source and the second channel light source are spaced apart from each other in a direction perpendicular to the optical axis of the first collimator.

8. The optical sensor of claim 7, wherein each of the first channel light source and the second channel light source is spaced apart from the optical axis of the first collimator.

9. The optical sensor of claim 8, wherein the reference grating is disposed at a side at which light emitted from the first channel light source is converted into parallel light by the first collimator and is incident to the reference grating, and
the sensing grating is disposed at a side at which light emitted from the second channel light source is converted into parallel light by the first collimator and is incident to the sensing grating.

10. The optical sensor of claim 5, further comprising:
a second collimator provided between the photodetector and the oscillating part.

11. The optical sensor of claim 1, wherein an anti-reflective film is deposited on a surface of the oscillating part facing the first collimator, and the oscillating part is a two-channel single integrated laser diode, in which each of the first channel light source and the second channel light source is a super luminescence diode.

12. The optical sensor of claim 11, wherein the photodetector is disposed so as to face an opposite surface of the surface of the oscillating part on which the anti-reflective film is deposited, and
the surface of the oscillating part facing the photodetector is a reflective surface.

13. The optical sensor of claim 12, wherein each of the first channel light source and the second channel light source is extended from the surface of the oscillating part, on which the anti-reflective film is deposited, to the opposite surface of the oscillating part.

14. An optical sensor, comprising:
an external cavity laser configured to output sensing light and reference light;
a photodetector configured to detect a beating signal by an interference of the sensing light and the reference light output from the external cavity laser; and
a coupler configured to optically couple the external cavity laser and the photodetector,
wherein the external cavity laser includes
a reflecting filter including a sensing grating, to which a sensing object is attachable, and a reference grating, which is disposed on the same plane as that of the sensing grating, and outputs sensing light reflected from the sensing grating and reference light reflected from the reference grating, and an oscillating part, in which a first channel light source outputting the reference light and a second channel light source outputting the sensing light are formed, wherein the oscillating part is located between the photodetector and the reflecting filter.

15. The optical sensor of claim 14, wherein the coupler multiplexes the sensing light and the reference light input from the external cavity laser and outputs a beating signal by the interference of the sensing light and the reference light, and the photodetector detects the beating signal output from the coupler.

16. The optical sensor of claim 15, wherein the coupler includes a Y coupler including a reference light waveguide, into which the reference light is input, a sensing light waveguide, into which the sensing light is input, and an output waveguide, in which the reference light waveguide and the sensing light waveguide are joined and extended.

17. The optical sensor of claim 16, wherein the coupler further includes diffraction reflective gratings (distributed Bragg reflectors), which are coupled to an input terminal of the reference light waveguide and an input terminal of the sensing light waveguide, respectively.

18. The optical sensor of claim 16, wherein the first channel light source is optically coupled with the reference light waveguide, and the second channel light source is optically coupled with the sensing light waveguide.

19. The optical sensor of claim 18, wherein the external cavity laser further includes a first collimator located between the oscillating part and the reflecting filter, the oscillating part, the first collimator, and the reflecting filter are arranged along an optical axis of the first collimator, the output waveguide is extended along the optical axis of the first collimator, and each of the first channel light source and the second channel light source is extended so as to align with the optical axis of the first collimator and is spaced apart from the optical axis of the first collimator.

* * * * *